United States Patent [19]
Gruen et al.

[11] Patent Number: 5,620,512
[45] Date of Patent: Apr. 15, 1997

[54] DIAMOND FILM GROWTH FROM FULLERENE PRECURSORS

[75] Inventors: Dieter M. Gruen, Downers Grove; Shengzhong Liu, Woodridge; Alan R. Krauss, Naperville; Xianzheng Pan, Woodridge, all of Ill.

[73] Assignee: University of Chicago, Chicago, Ill.

[21] Appl. No.: 143,866

[22] Filed: Oct. 27, 1993

[51] Int. Cl.$^6$ .................................................. C30B 29/04
[52] U.S. Cl. .......................... 117/108; 117/109; 117/929; 423/445 B; 423/446
[58] Field of Search .................................. 117/929, 108, 117/109; 423/445 B, 446

[56] References Cited

U.S. PATENT DOCUMENTS

| | | | |
|---|---|---|---|
| 4,559,901 | 12/1985 | Morimoto et al. | 118/723 |
| 4,629,631 | 12/1986 | Dearnaley | 427/38 |
| 4,634,600 | 1/1987 | Shimizu et al. | 427/38 |
| 4,816,286 | 3/1989 | Hirose | 423/446 |
| 5,015,494 | 5/1991 | Yamazaki | 423/446 |
| 5,132,105 | 7/1992 | Remo | 423/446 |
| 5,209,916 | 5/1993 | Gruen | 423/446 |
| 5,273,788 | 12/1993 | Yu | 427/554 |
| 5,328,676 | 7/1994 | Gruer | 423/446 |
| 5,360,477 | 11/1994 | Inoue et al. | 117/929 |
| 5,370,855 | 12/1994 | Gruen | 423/446 |

OTHER PUBLICATIONS

Parker, D.H. et al, "High Yield Synthesis, Separation and Mass Spectrometric Characterization of Fullerenes $C_{60}$ to $C_{266}$"; J. Am. Chem. Sco. 113, 7499–7503 (1991).

Wurz, P. and Lykke, R.; "Delayed Electron Emission from Photoexcited $C_{60}$"; J. Chem. Phys. 95, 7008–7010 (1991).

Lykke, K.R. et al,, "Spectrometric Characterization of Purified $C_{60}$ and $C_{70}$"; Mats. Res. Soc. Symposium Proc. vol. 206, 679 (1991).

Wasielewski, M.R., et al. "Triplet States of Fullernes $C_{60}$ and $C_{70}$; Electron Paramagnetic Resonance Spectra, Photophysics and Electronic Structures"; J. Am. Chem. Soc. 113, 2774–2776 (1991).

Beck, Rainer D. et al, "Resilience of All–Carbon Molecules $C_{60}$ and $C_{84}$.". A Surface–Scattering Time–of–Flight Investigation; J. Chem. Phys. 1991, 95, 8402–8409.

Van, Jon; "Exotic Form Opens New Carbon Uses"; Chicago Tribune, Sunday Nov. 3, 1991.

Angus, John C. et al; "Metastable Growth of Diamond and Diamond–Like Phases"; Annu. Rev. Mater. Sci. 1991. 21:221–48.

Curl, Robert F. et al; "Fullerenes"; Sci Amer. Oct. 1991, 54–63.

(List continued on next page.)

*Primary Examiner*—Robert Kunemund
*Attorney, Agent, or Firm*—Reinhart, Boerner, Van Deuren, Norris & Rieselbach, s.c.

[57] ABSTRACT

A method and system for manufacturing diamond film. The method involves forming a fullerene vapor, providing a noble gas stream and combining the gas with the fullerene vapor, passing the combined fullerene vapor and noble gas carrier stream into a chamber, forming a plasma in the chamber causing fragmentation of the fullerene and deposition of a diamond film on a substrate.

17 Claims, 6 Drawing Sheets

OTHER PUBLICATIONS

Meijer, Gerard et al; "Laser Deposition of Carbon Clusters on Surfaces: A New Approach to the Study of Fullernes"; J. Chem. Phys. 93(11), Dec. 1990.

Edelson, Edward; "Buckyball The Magic Molecule"; Popular Science, Aug. 1991, 52–57; 87.

Kroto, H.W. et al; "$C_{60}$: Buckminster Fullerene"; Chem. Rev. 1991, 91, 1213–1235.

Kratschmer, W. et al.; "Solid $C_{60}$: A New Form of Carbon", Nature, vol. 347, 27 Sep. 1990, pp. 354–358.

Wang, H. H. et al. "Superconductivity at 28.6 K in a Rubidium—$C_{60}$ Fullerene Compound, $Rb_xC_{60}$, Synthesized by a Solution Phase Technique," Inorg. Chem. 30. 2962, (1991).

Frenklach, Michael et al; "Growth Mechanism of Vapor–Deposited Diamond"; J. Mater. Res. 3(1) Jan./Feb. 1988, 133–139.

"Near specular reflection of $C_{60}$ ions in collisions with an HOPG graphic surface", Busmann, H. G. et al., Chem. Phys. Ltrs. 187, 459 (1991).

Moffat, A.S., "When Diamonds Met Buckyballs," *Science*, vol. 254, Nov. 8, 1991, p. 800.

Meilunas et al, "Nucleation of diamond films on surfaces using carbon clusters," *Applied Physics Letters*, vol. 59, No. 26 Dec. 23, 1991, pp. 3661–3463.

Meilunas et al., "Activated $C_{70}$ and diamond", Nature, 354, Nov. 28, 1991, p. 271.

Regueiro et al., "Crushing $C_{60}$ to diamond at room temperature," Nature, 355, Jan. 16, 1992, pp. 237–239.

Geis et al., "Diamond Film Semiconductors," Sci. Amer., Oct. 1992, pp. 84–89.

Wang et al., "First Easily Reproduced Solution–Phase Synthesis and Confirmation of Superconductivity in the Fullerene $K_xC_{60}(T_c=18.0\pm0.1K)$," Inorg. Chem., 1991, 30.

Gao et al, "Study on Fullerene (C60) And Diamond Single Crystals By Using a Microscope", Rengeng Jengti Xuebao (1992), 21(3) pp. 273–279 abs. only.

DIAMOND FILM GROWTH FROM FULLERENE PRECURSORS

The United States Government has rights in this invention pursuant to Contract W-31-109-ENG-38 between the U.S. Department of Energy and the University of Chicago.

The present invention is directed generally to a system and method for manufacturing diamond films from fullerene precursors. More particularly, the invention is concerned with a system and method for making diamond films by microwave dissociation of a gaseous carbon compound using an excited plasma containing noble gas or combination of noble gases. This method is carried out in the absence of, or without the addition of, hydrogen or oxygen to the plasma utilized in making the diamond film.

Diamond films exhibit a combination of outstanding properties including exceptional hardness, thermal conductivity, electrical resistance, chemical inertness, optical transmittance, electrical carrier mobility and dielectric breakdown strength. These outstanding physical and chemical properties have led to widespread efforts to develop improved methods of manufacturing diamond films. Prior art methods have been directed to chemical vapor deposition using a hydrogen gas atmosphere. The hydrogen gas is dissociated into atomic hydrogen in the reaction vessel, and the atomic hydrogen is then reacted with various carbon containing compounds to form condensable carbon radicals, including elemental carbon which is deposited to form the diamond layers. Typically, diamond films are grown using about one mole percent of a hydrocarbon precursor (such as methane) in a hydrogen gas atmosphere. It is conventionally accepted that hydrogen gas is essential for the diamond thin film growth process.

In such conventional methods of manufacture, hydrogen in varying amounts is invariably incorporated into the growing diamond film which gives rise to a variety of structural, electronic and chemical defects relative to pure diamond film. Although it is known that diamond film manufactured using hydrogen contains such defects, experimental results and theoretical works on growth mechanisms conclude that hydrogen must be present during diamond film growth processes. For example, it has been shown that diamond film can be obtained using CO and $CO_2$ gas after exposing the initially produced deposits periodically to hydrogen in order to remove nondiamond carbon deposits. Methods of manufacture using methane-argon or methane-helium atmospheres have also been employed, but resulted only in formation of graphite or diamond-like carbon films, not diamond. Other researchers used methane-helium mixtures, but obtained growth of diamond films only when a methane-helium discharge atmosphere was alternated with a hydrogen-oxygen-helium discharge atmosphere. Further research work has determined that the alleged lower limit for diamond film growth in the $CO-H_2$ system required at least 0.5 mole percent hydrogen gas. Finally, although defects arise from the presence of hydrogen, various theoretical approaches have concluded that hydrogen is a necessary part of the reaction steps in forming diamond film in chemical vapor deposition reactions.

It is therefore an object of the invention to provide an improved system and method for manufacturing a diamond film.

It is another object of the invention to provide a novel system and method for manufacturing a diamond film without use of a hydrogen or oxygen atmosphere.

It is an additional object of the invention to provide an improved system and method for manufacturing a diamond film employing fullerene molecule precursors.

It is a further object of the invention to provide a novel system and method for manufacturing a diamond film by chemical vapor deposition from decomposition of fullerene molecules.

It is yet another object of the invention to provide an improved system and method for manufacturing a diamond film from a fullerene molecular gas decomposed by noble gas/fullerene molecule collisions.

It is still an additional object of the invention to provide a novel system and method for manufacturing a diamond film by excitation of an argon gas to metastable states able to transfer energy to a fullerene molecule causing decomposition to form the diamond film.

It is also an object of the invention to provide an improved method and system for making a diamond film by microwave energy decomposition of fullerene molecules in the presence of a noble gas, such as argon.

These and other objects of the invention will be described in detail in the detailed description provided hereinbelow and taken in conjunction with drawings described below.

DETAILED DESCRIPTION OF PREFERRED EMBODIMENTS

Figure 1A:
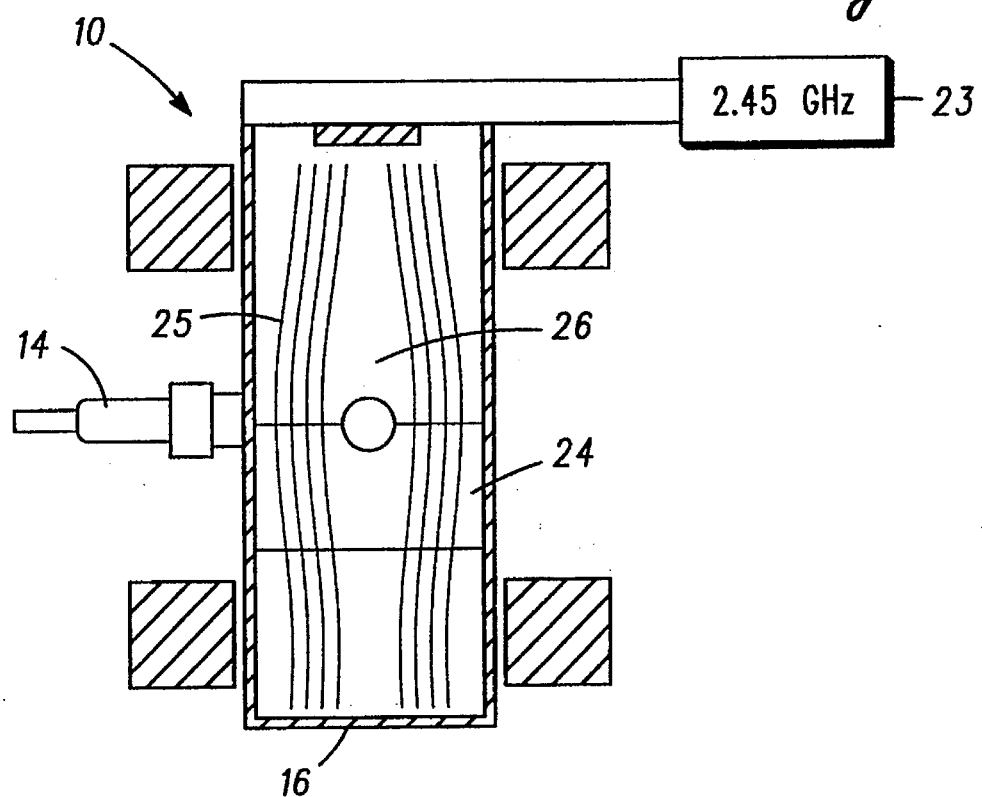
FIGS. 1(a) and 1(b) illustrate a system constructed in accordance with the invention for manufacturing diamond film.
Figure 1B:
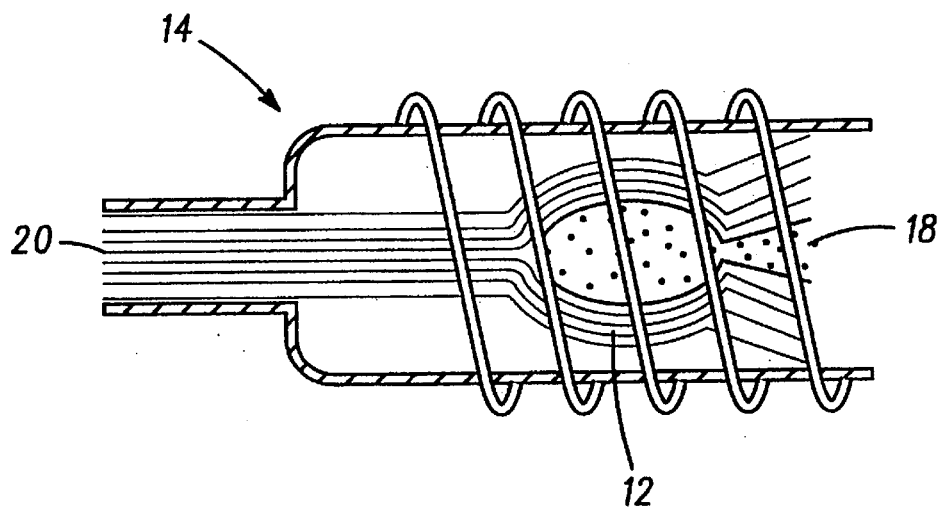

A microwave plasma deposition system 10 (hereinafter "system 10") constructed in accordance with the invention is illustrated in FIGS. 1(a) and 1(b). The system 10 is based on a ASTeX (PDS-17) commercial plasma deposition apparatus manufactured by Applied Science and Technology. Fullerene containing soot 12 used as a starting material was treated to remove hydrocarbon contaminants by contact with methanol. The treated soot 12 was then thoroughly degassed by conventional vacuum and/or thermal treatment. The degassed soot 12 was placed in a sublimator 14 which is coupled to plasma deposition chamber 16, and the volume of the sublimator 14 is also coupled to the volume of the plasma deposition chamber 16. Thus, fullerene containing vapor 18 can be introduced into the plasma deposition chamber 16 by heating the sublimator 14 to a temperature adequate to cause fullerene sublimation (such as, about 550° C.). A noble carrier gas (such as argon) is introduced through gas inlet 20 enabling the argon gas to transport the sublimed fullerene containing vapor 18 into the plasma deposition chamber 16. Under saturation conditions the atomic carbon content in the argon gas introduced into the chamber 16 is about 0.14 mole % (based on the vapor pressure of pure $C_{60}$). A substrate 22 was used to accumulate deposited carbon as a diamond layer on the substrate 22, and preferably the substrate 22 is a single crystal silicon wafer. The substrate 22 can also be disposed on a graphite stage 24 which not only can support the substrate 22 but can act as a heating element to control the substrate temperature. Using a microwave generator 23, a microwave field 25 is established within the plasma deposition chamber 16 in order to generate an excited plasma 26.

Figure 2:
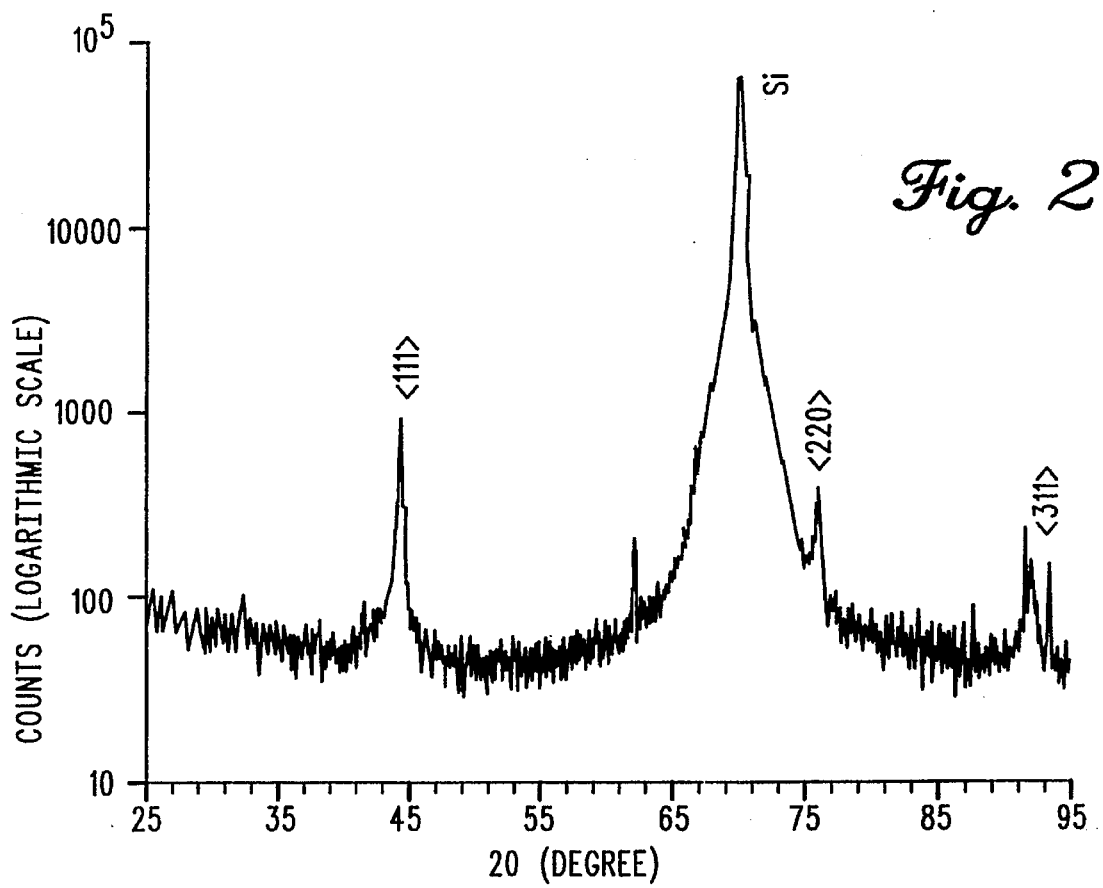
FIG. 2 illustrates an X-ray diffraction pattern for a diamond film on a silicon substrate with diamond grown by a method of the invention.

The system 10 operates to deposit diamond on the substrate 22, and the diamond was characterized by X-ray diffraction, electron diffraction, transmission and scanning electron microscopy, electron energy loss spectroscopy and Raman spectroscopy. X-ray diffraction examination of the diamond layers showed the three major diamond diffraction peaks corresponding to the (111), (220) and (311) reflections (see FIG. 2). Particular regions of the diamond layer were also examined by selected area electron diffraction and confirmed the lattice of the film was a face centered cubic structure with lattice constant of 3.53±10 Angstroms (the accepted diamond lattice constant is 3.56 Anstroms).

Figure 4:
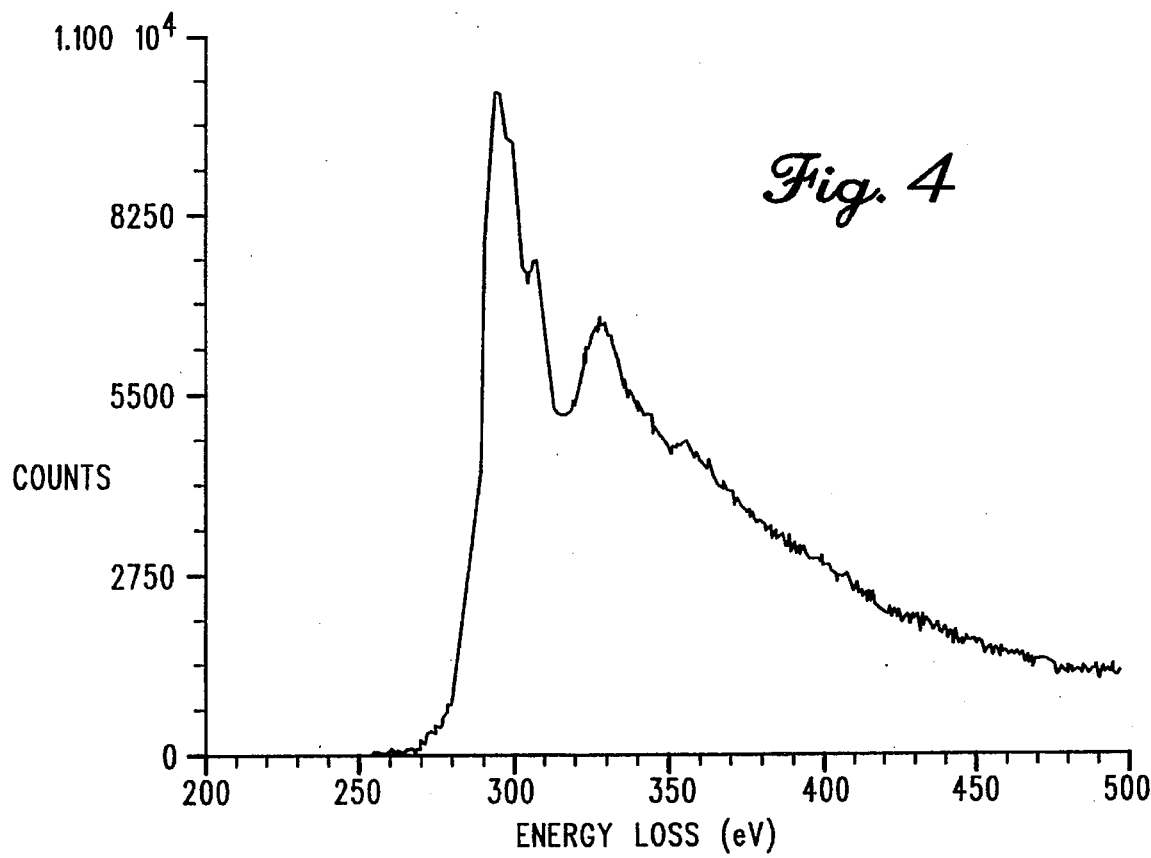
FIG. 4 illustrates an electron energy loss spectrum from a diamond film grown in accordance with the invention.
Figure 5:
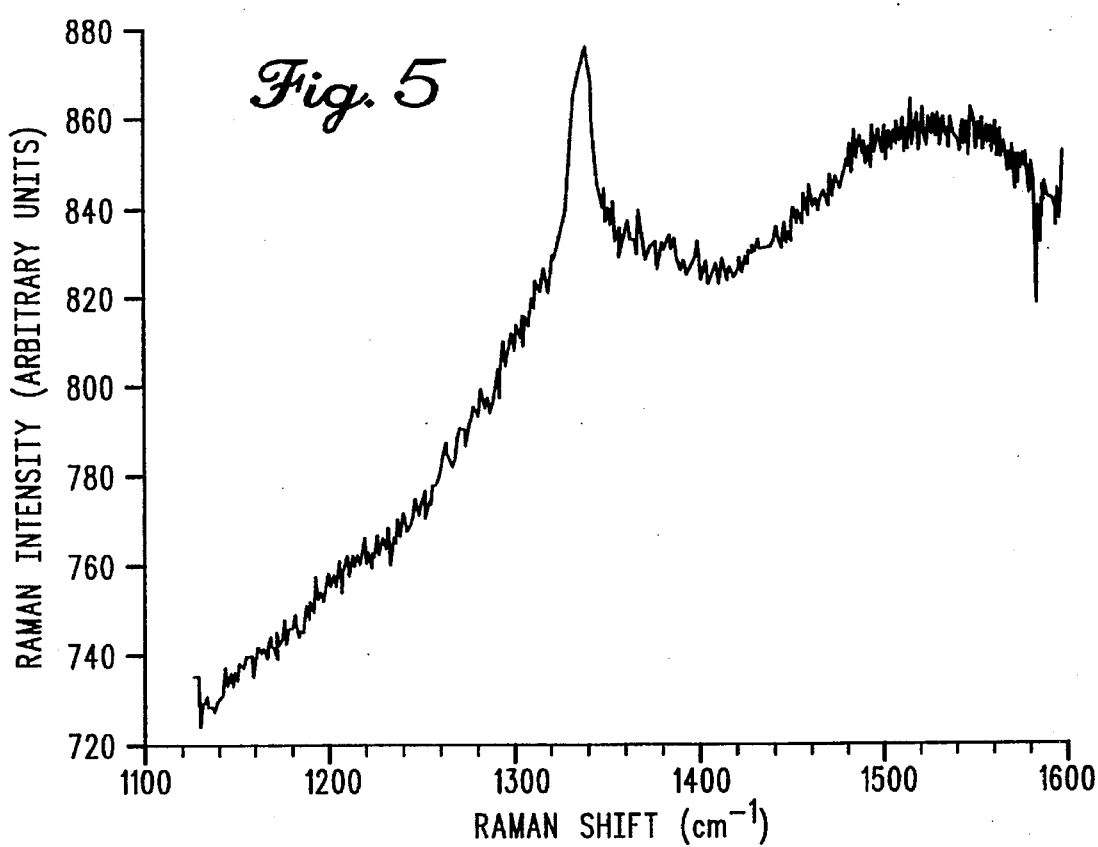
FIG. 5 illustrates a Raman spectrum from a diamond film grown in accordance with the invention.

Transmission electron microscopy further determined that the diamond film was very find grained (about 0.05 to 0.3 microns diameter), and the intergranular boundaries are free from graphitic contamination. Further characterization was performed by electron energy loss spectroscopy. The deposited specimen layers were examined and a plasmon peak was identified at about 291 eV, with no evidence of a graphite or amorphous carbon peak at 285 eV (see FIG. 4). Additional analysis was performed on the deposited specimen layers by Raman spectroscopy which revealed a band centered at 1333 cm$^{-1}$ and a broad band feature at about 1550 cm$^{-1}$. The 1333 cm$^{-1}$ band is characteristic of small grain size diamond films, and the 1550 cm$^{-1}$ band feature is also commonly observed from small grain size diamond films.

The following nonlimiting examples set forth exemplary methods of manufacture of diamond films and other related methods.

EXAMPLE I

A $C_{60}$ sublimation source was coupled to a microwave chamber operated with a microwave generator at 2.5 GHz. The system as a whole is an ASTeX PDS-17 unit supplied by Applied Science and Technology. Fullerene containing soot was made in a conventional manner or was obtained from MER Corporation. The soot was treated with methanol to remove most of the hydrocarbon constituents. The cleaned soot was place in a gold container which in turn was disposed in a quartz tube wound with nichrome wire used to heat the soot. The microwave chamber was evacuated and the soot heated to 250° C. for two hours to remove residual methanol solvent, hydrocarbons and absorbed gases. The rate of $C_{60}$ sublimation was determined by placing a silicon wafer in front of the outlet of the sublimation source inside the microwave chamber. An argon gas flow of 20 sccm with a total pressure in the chamber of 100 Torr was established by use of a carrier gas inlet into the sublimation source. The sublimation source was maintained at about 500° C., and adequate $C_{60}$ was deposited in one-half an hour on the silicon single crystal so that a typical $C_{60}$ infrared spectrum could be easily noted. There were no features in the infrared spectrum that could be attributed to species other than $C_{60}$.

EXAMPLE II

The same manufacturing procedure set forth in Example I was followed except the silicon wafer was removed, and fresh soot was placed in the sublimation source. The temperature of the sublimation source was raised to about 500° C., the microwave generator was activated and a 500 watt microwave discharge was initiated at 1 Torr argon. A quartz fiber optic cable was coupled to the microwave chamber to enable viewing of the plasma discharge at a region about 1–1.5 cm above the silicon substrate. The light within the fiber optic cable was transmitted to an Interactive Technology model 103 optical monochromator with 200 micron entrance and exit slit widths. The monochromator wavelength was stepped in increments of ≦2.3 Angstroms with a dwell time of ≧100 msec/step. The light detector was a Peltier cooled photomultiplier tube operating in a pulse counting mode with a dark count rate of 20–30 cps. A Macintosh IIci control computer was used with software to provide a 100 msec gating pulse to the 32 bit National Instruments counter board located in the computer back plane.

Figure 3A:
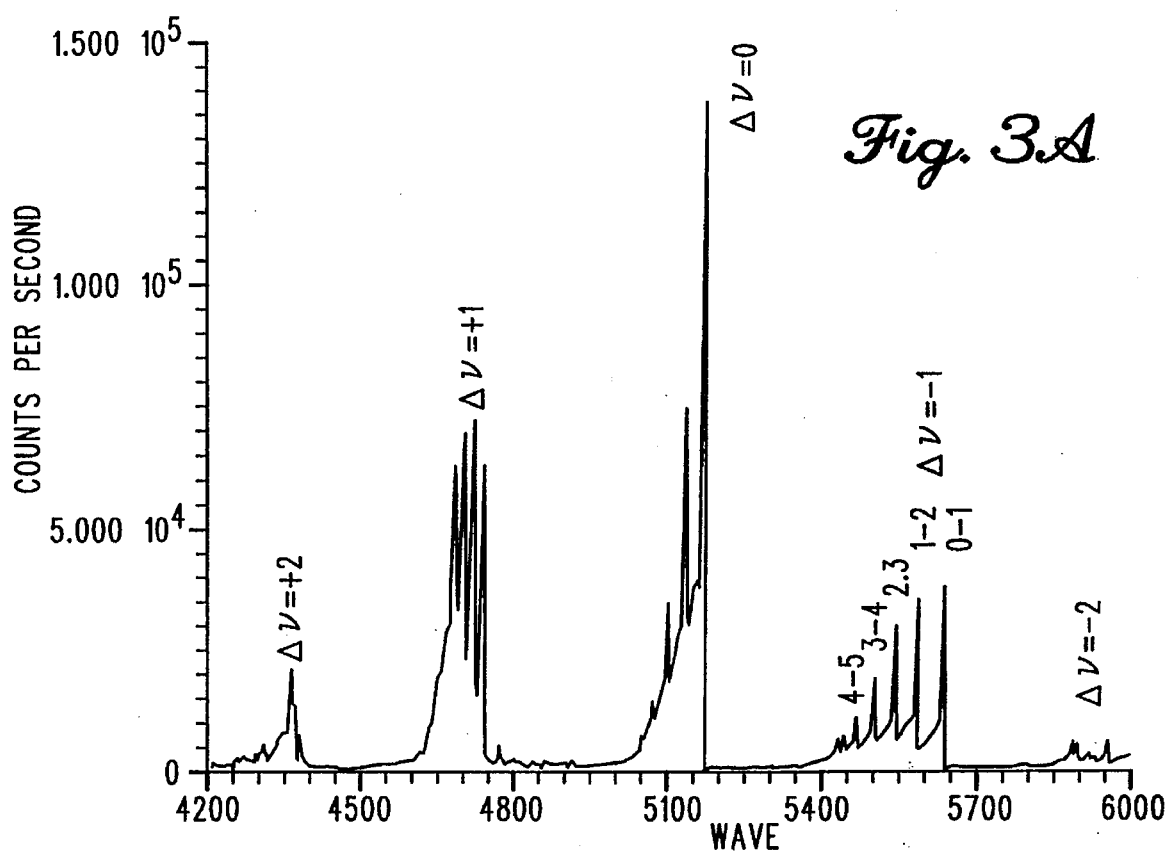
FIG. 3A illustrates an emission spectrum for a plasma in the system of the invention.
Figure 3B:
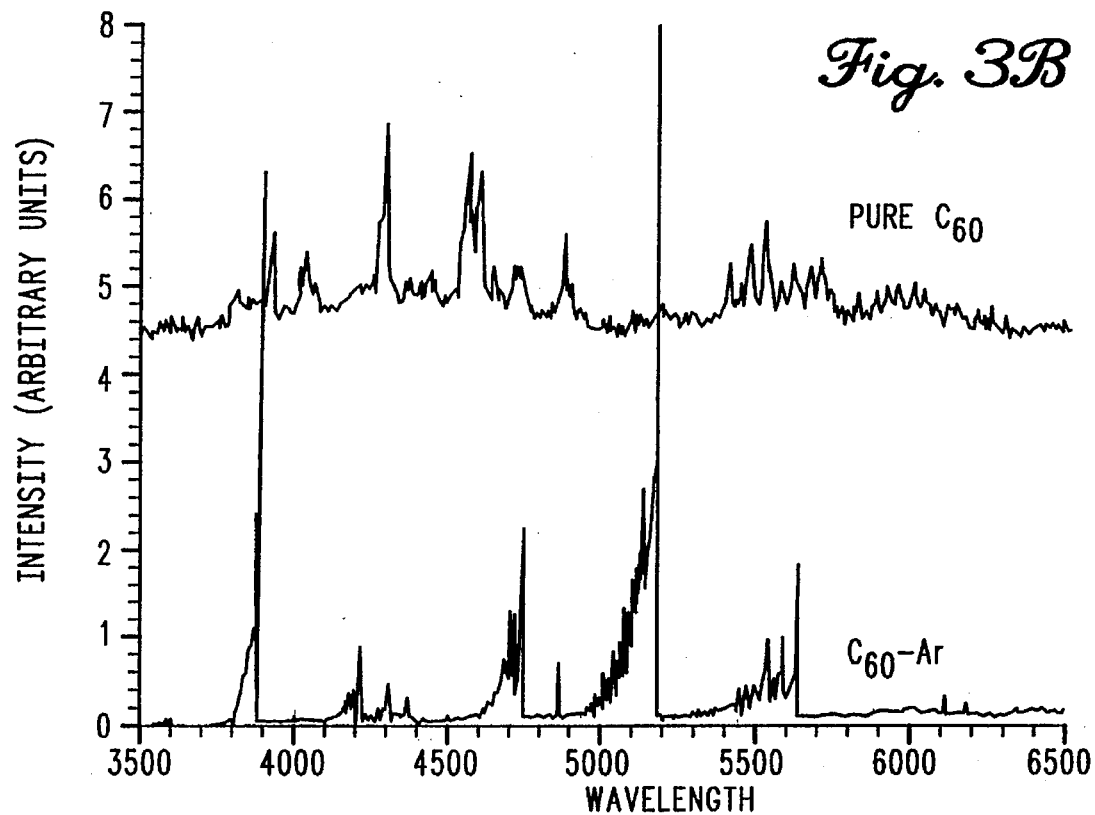
FIG. 3B compares the plot of FIG. 3A to the spectrum for a plasma without a noble carrier gas present (top plot)

A typical spectrum obtained from the intensely emerald green plasma discharge is shown in FIG. 3A. The spectrum is dominated by the $d^3 \Pi g$–$a^3 \Pi \mu$ Swan bands of $C_2$(carbon dimer), particularly the $\Delta v = -2, -1, 0, +1, +2$ sequences. This can be compared to the spectral output in the absence of a noble carrier gas as shown in FIG. 3B which does not exhibit $C_2$ bands.

It should also be noted that intense emissions are also observed characteristic of excited argon atoms in the 6000–8000 Angstrom range. Argon neutrals in such metastable states as $^3P_2$ at 11.55 eV can lead to efficient energy transfer to the $C_{60}$ molecules and consequent fragmentation.

EXAMPLE III

Figure 3C:
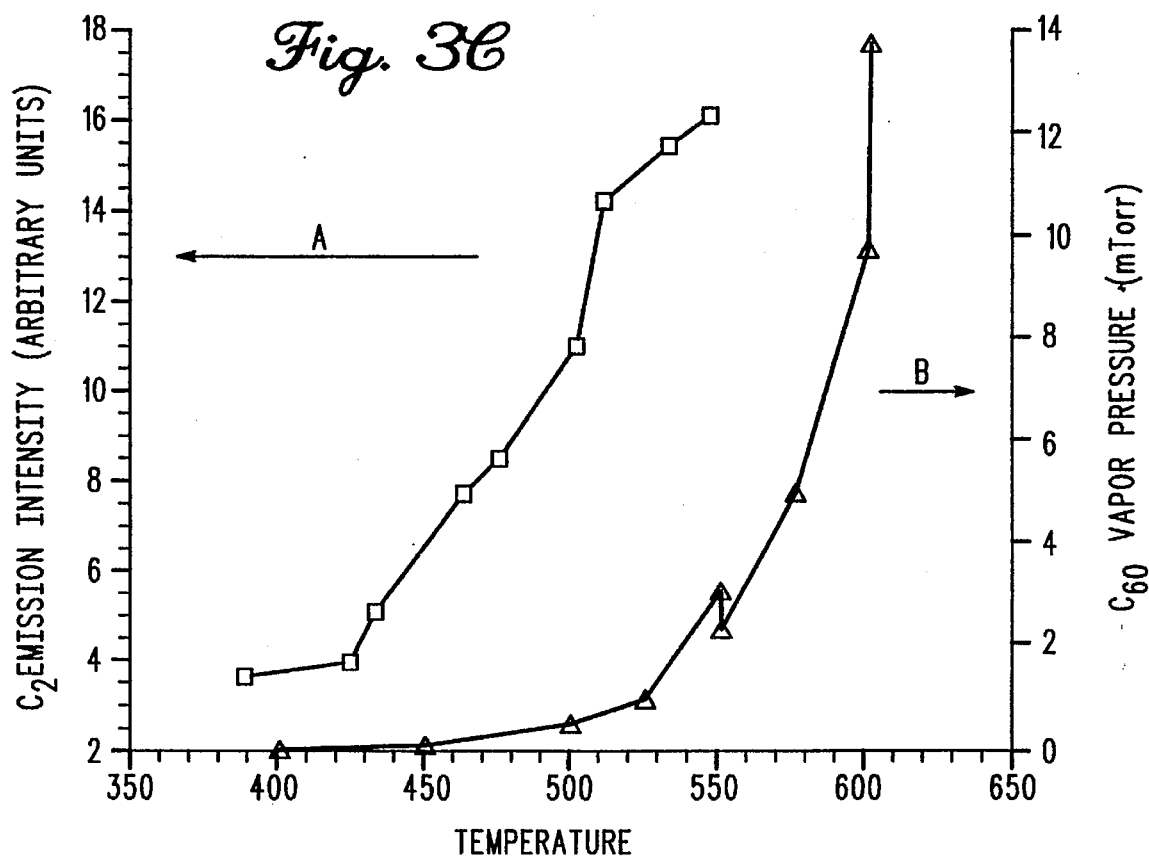
FIG. 3C shows $C_{60}$ vapor pressure and integrated intensity of the $\Delta v=0$ band from $C_2$ emissions.

An examination of the Swan bands in FIG. 3A was performed by analyzing emission spectra as a function of sublimator source temperature. The Swan band emission intensities were found to increase as a function of sublimator temperature (see FIG. 3C). Under saturation conditions of the argon carrier gas, the emission intensities should follow the vapor pressure of $C_{60}$ (see FIG. 3C, curve B). However, a log plot clearly shows that the argon carrier gas is far from being saturated with the equilibrium $C_{60}$ pressure. The $C_2$ concentration in the plasma increases with temperature due to increased $C_{60}$ volatility which shows the $C_2$ emission is not a minor constituent, nor is it due to carbon particles transported into the plasma. Continuation of this method of manufacture for a period of time (several hours or more) at sublimator temperatures of 550° C. results in depletion of $C_{60}$ and higher fullerenes, as evidenced by decreasing Swan band intensities in the spectra. After such a prolonged time of operation, lowering the temperature to 500° C. results in emission spectra having intensities diminished by a factor of ten compared to those obtained with a fresh batch of soot.

EXAMPLE IV

The same basic method of Example II was followed except the microwave power level was varied from 500 to 1200 watts. There was no noticeable change in the absolute intensity or the intensity ratios of the different Swan band frequencies.

EXAMPLE V

Figure 6A:
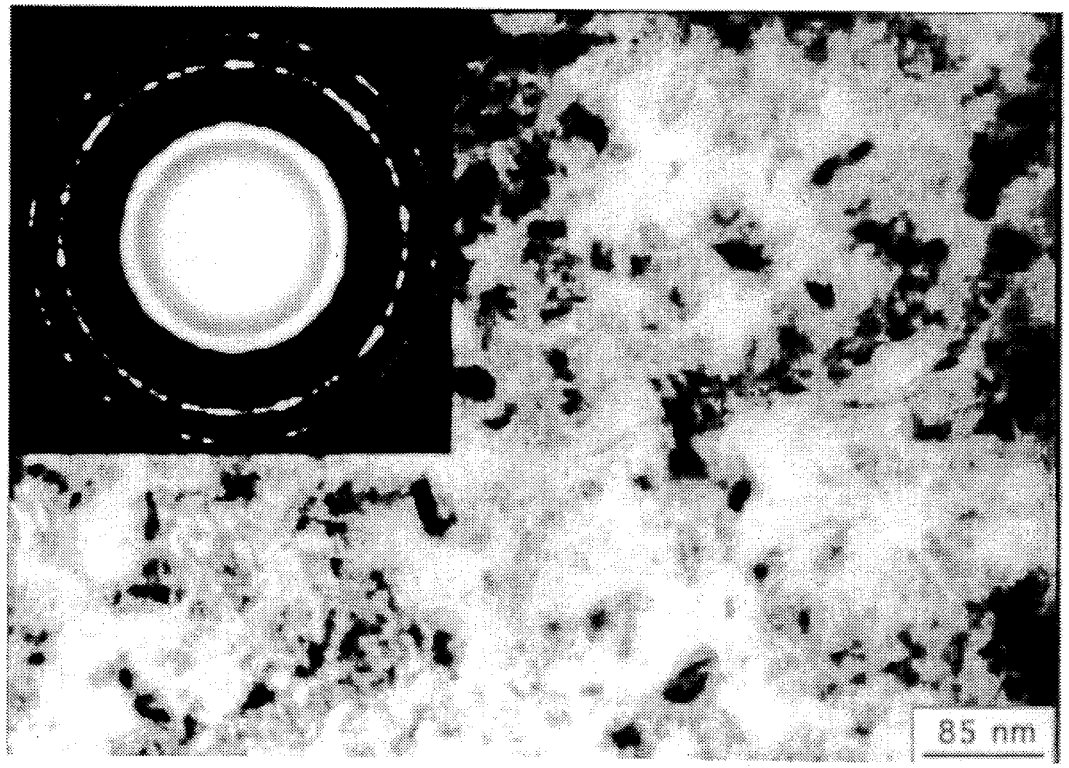
FIG. 6A illustrates a transmission electron microscope (TEM) micrograph from a diamond film of the invention with a selected area electron diffraction pattern inset.
Figure 6B:
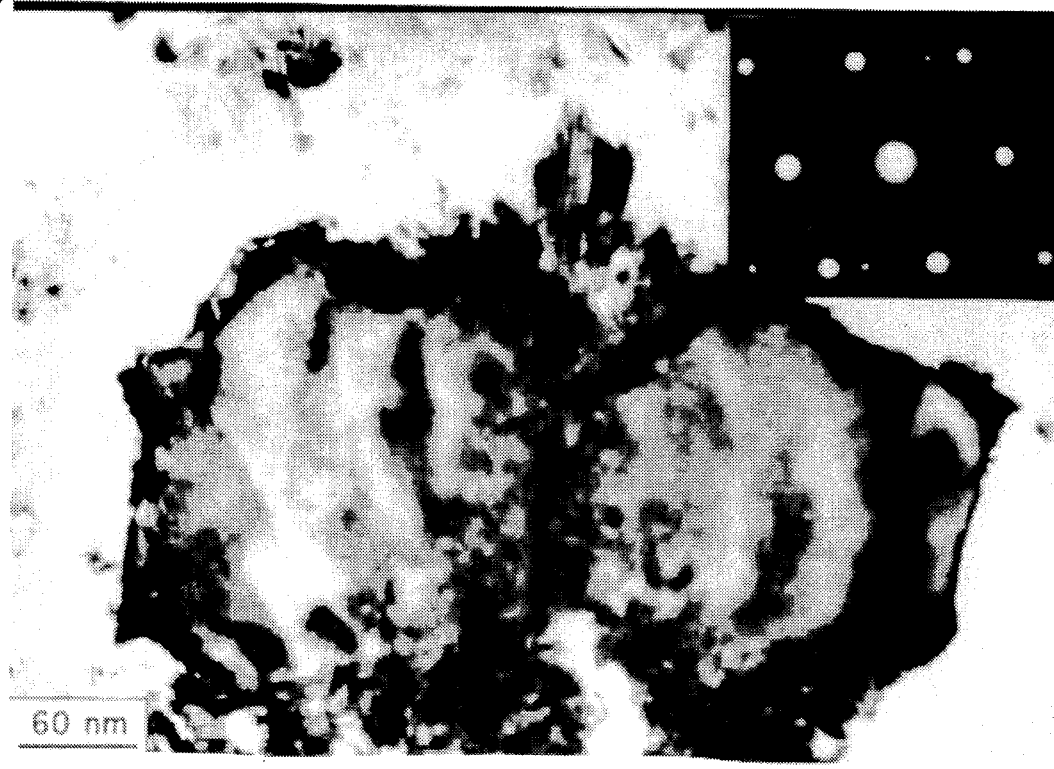
FIG. 6B illustrates a TEM micrograph of two diamond grains from a diamond film of the invention with the grains having a common <111> orientation.

The growth rate of diamond film in Example II was characterized to be about 1.2 microns/hour which is higher than, or comparable to, the deposition rate observed using 1% methane in hydrogen under similar system deposition conditions. Micrographs from both SEM and TEM (see FIG. 6) show much smaller defect density compared to films prepared at 300 mTorr with a magnetized plasma using $CH_4$-$H_2$-$O_2$ mixtures as prepared by the applicants herein. The films prepared by the method of the invention also show no evidence of graphite contamination.

EXAMPLE VI

The procedure described in Example I was followed except that the chamber pressure was 50 mTorr, using an Ar flow rate >10 sccm with an upper magnet current of 150 A and a lower magnet current of 115 A to improve plasma stability. The microwave power was 500 watts, and the fullerene sublimator heater was operated at 110 volts, resulting in a sublimation source temperature of about 500° C. An intense $C_2$-rich green plasma with an optical emission spectrum similar to that of FIG. 3A was obtained.

While preferred embodiments of the invention have been shown and described, it will be clear to those skilled in the art that various changes modifications can be made without departing from the invention in its broader aspects as set forth in the claims provided hereinafter.

What is claimed is:

1. A method for manufacturing a diamond film on a substrate, comprising the steps of:
   (a) forming a fullerene vapor including $C_{60}$;
   (b) providing a noble gas stream free of hydrogen and combining said fullerene vapor with said noble gas stream;
   (c) passing said combined fullerene vapor and noble gas carrier stream into a chamber;
   (d) forming a plasma in said chamber, and the presence of said noble gas enabling fragmentation of said fullerene in said plasma to preferentially form carbon dimer species; and
   (e) depositing said fragmented fullerene, containing carbon dimer species generated in said plasma by the presence of said fullerene vapor with said noble gas, onto said substrate to form said diamond film.

2. The method as defined in claim 1 wherein said step (a) comprises heating a fullerene containing solid to form said fullerene vapor.

3. The method as defined in claim 2 wherein said heating step comprises heating said fullerene containing solid to a temperature of at least about 500° C.

4. The method as defined in claim 1 wherein said step (b) comprises entraining said fullerene vapor in said noble gas stream.

5. The method as defined in claim 4 wherein the noble gas stream is selected from the group consisting of a gas stream of argon, helium, neon, xenon and krypton.

6. The method as defined in claim 1 wherein said step (d) comprises establishing a microwave field within said chamber.

7. The method as defined in claim 1 wherein said substrate comprises a silicon substrate.

8. The method as defined in claim 1 wherein said plasma in step (d) is free from species selected from the group consisting of hydrogen and oxygen.

9. A system for manufacturing a diamond film on a substrate, comprising:
   a source of fullerene soot;
   means for generating a fullerene vapor from said fullerene soot;
   means for providing a noble gas stream and combining said fullerene vapor with said noble gas stream to form a combined gas atmosphere substantially free of hydrogen;
   a chamber for receiving said combined fullerene vapor and noble gas stream; and
   means for producing a microwave field within said chamber, the microwave field causing formation of a plasma containing excited fullerene species and excited noble gas, and said means for producing a microwave field causing fragmentation of fullerene to molecules including $C_2$, thereby resulting in deposition on said substrate of $C_2$, with fragmentation of the fullerene occurring above said substrate and accumulation of said diamond film on said substrate.

10. The system as defined in claim 9 wherein said substrate consists essentially of a single crystal of silicon.

11. The system as defined in claim 9 further including a graphite stage including means for heating to control temperature of said substrate.

12. A method for manufacturing a diamond film on a substrate, comprising the steps of:
   (a) providing a fullerene containing soot substantially free from hydrocarbons;
   (b) supplying energy to said fullerene containing soot to form a fullerene vapor;
   (c) providing a noble gas stream and entraining said fullerene vapor therein;
   (d) passing said noble gas stream and fullerene vapor into a chamber;
   (e) applying an energy field to said fullerene vapor and noble gas stream in said chamber to form a plasma containing fragmented fullerene species including $C_2$ species;
   (f) depositing $C_2$ species already fragmented in said plasma onto said substrate, thereby forming said diamond layer thereon.

13. The method as defined in claim 12 wherein said method is performed without adding a species selected from the group consisting of hydrogen and oxygen.

14. The method as defined in claim 12 wherein said noble gas stream is selected from the group consisting of a gas stream of argon, neon, krypton, xenon and helium.

15. The method as defined in claim 12 wherein said step (e) comprises at least one of (1) applying a microwave field, (2) striking a high voltage arc between an anode and a cathode and (3) applying a laser beam to said noble gas stream and said fullerene vapor.

16. The method as defined in claim 12 wherein said step (e) further includes exciting said noble gas stream to a metastable state suitable for transferring energy from said noble gas to said fullerene vapor to cause fragmentation thereof.

17. The method as defined in claim 12 where said step (d) comprises establishing a noble gas flow rate >10 sccm thereby obtaining substantially $C_2$ within said chamber.

* * * * *

UNITED STATES PATENT AND TRADEMARK OFFICE
CERTIFICATE OF CORRECTION

PATENT NO. : 5,620,512
DATED : April 15, 1997
INVENTOR(S) : DIETER M. GRUEN, ET AL.

It is certified that error appears in the above-indentified patent and that said Letters Patent is hereby corrected as shown below:

Column 1, line 3, please insert the following:

--This application is a continuation-in-part of serial no. 35,419 filed March 23, 1993, patent no. 5,370,855, which is a continuation-in-part of serial no. 797,590 November 25, 1991, patent no. 5,209,916.--

Signed and Sealed this

Twenty-first Day of October 1997

Attest:

BRUCE LEHMAN

Attesting Officer

Commissioner of Patents and Trademarks